(12) United States Patent
Chen et al.

(10) Patent No.: US 8,535,960 B2
(45) Date of Patent: Sep. 17, 2013

(54) METHOD FOR PACKAGING LIGHT EMITTING DIODE HAVING FLUORESCENT MATERIAL DIRECTLY COATED ON LED DIE THEREOF

(75) Inventors: Pin-Chuan Chen, Hsinchu (TW); Hsin-Chiang Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/600,147

(22) Filed: Aug. 30, 2012

(65) Prior Publication Data

US 2013/0164868 A1  Jun. 27, 2013

(30) Foreign Application Priority Data

Dec. 27, 2011 (CN) .......................... 2011 1 0443706

(51) Int. Cl.
 *H01L 21/00* (2006.01)
(52) U.S. Cl.
 USPC ........................................... 438/26; 438/127
(58) Field of Classification Search
 USPC ........................................ 438/26, 34–35, 127
 See application file for complete search history.

(56) References Cited

U.S. PATENT DOCUMENTS

| | | | | |
|---|---|---|---|---|
| 6,924,233 B1 * | 8/2005 | Chua et al. | ..................... | 438/678 |
| 7,256,057 B2 * | 8/2007 | Schardt et al. | ................... | 438/14 |
| 8,048,695 B2 * | 11/2011 | West | .............................. | 438/27 |

* cited by examiner

*Primary Examiner* — Richard Booth
(74) *Attorney, Agent, or Firm* — Altis Law Group, Inc.

(57) ABSTRACT

A method for packaging an LED, includes steps: providing a substrate; arranging an LED die on the substrate; forming a photoresist layer on the substrate to cover the LED die; arranging a mask directly on the photoresist layer; exposing the photoresist layer with the mask to a radiation source; removing the mask and the unexposed portion of the photoresist layer formerly sheltered by the mask, thereby leaving the exposed portion of the photoresist layer formerly unsheltered by the mask on the substrate, wherein the remained exposed portion of the photoresist layer surrounds the LED die; spraying fluorescent material toward the LED die surrounded by the remained exposed portion of the photoresist layer; removing the remained exposed portion of the photoresist layer; and finally encapsulating the LED die covered by the fluorescent material.

10 Claims, 13 Drawing Sheets

METHOD FOR PACKAGING LIGHT EMITTING DIODE HAVING FLUORESCENT MATERIAL DIRECTLY COATED ON LED DIE THEREOF

BACKGROUND

1. Technical Field

The present disclosure generally relates to a method for packaging light emitting diode (LED), and particularly to an LED packaging method wherein fluorescent material conformably and directly covers an LED die.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

A common LED includes a substrate, electrodes arranged on the substrate, a reflective cup arranged on the substrate, an LED die arranged in the reflective cup and electrically connected to the electrodes, an encapsulation covering the LED die, and fluorescent substance doped in the encapsulation.

In packaging the common LED, the fluorescent substance is firstly mixed in fluid encapsulating material, then the fluid encapsulating material is injected into the reflective cup to cover the LED die, and finally the encapsulating material mixed with fluorescent substance is solidified. However, during the solidifying process, the fluorescent substance suspending in the encapsulating material will deposit and undesirably cause a non-uniform distribution of the fluorescent substance in the encapsulating material. The uneven distribution of the fluorescent substance in the encapsulating material causes light generated by the common LED to have an uneven color.

Therefore, what is needed is to provide an LED packaging method which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED packaging method, in detail.

A method for packaging an LED in accordance with a first embodiment of the present disclosure includes steps of:

Step 1: providing a substrate with a first electrode and a second electrode arranged thereon;

Step 2: arranging an LED die on the substrate and electrically connecting the LED die to the first and second electrodes;

Step 3: forming a photoresist layer on the substrate to cover the LED die;

Step 4: arranging a mask directly on the photoresist layer;

Step 5: exposing the photoresist layer with the mask to a radiation source;

Step 6: removing the mask and the unexposed portion of the photoresist layer formerly sheltered by the mask, thereby leaving the exposed portion of the photoresist layer formerly unsheltered by the mask on the substrate, the remained exposed portion of the photoresist layer surrounding the LED die;

Step 7: spraying fluorescent material toward the LED die surrounded by the remained exposed portion of the photoresist layer;

Step 8: removing the remained exposed portion of the photoresist layer; and

Step 9: encapsulating the LED die directly and conformably covered by the fluorescent material.

Figure 1:
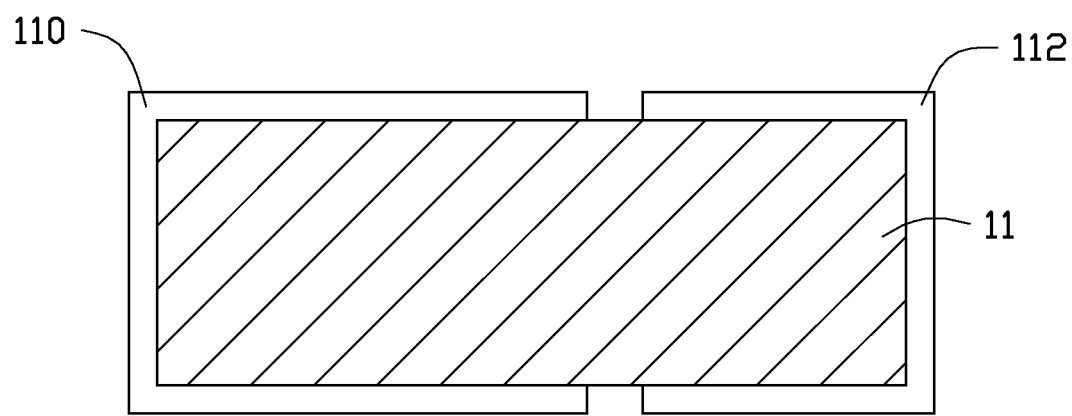
FIG. 1-FIG. 11 are schematic cross sections showing LED package structures processed by various steps of an LED packaging method in accordance with a first embodiment of the present disclosure.

In step 1, referring to FIG. 1, a substrate 11 is provided with a first electrode 110 and a second electrode 112 arranged thereon. The substrate 11 can be made of electrically insulated material, such as ceramic or polyphthalamide (PPA). The first electrode 110 and second electrode 112 respectively extend from a top surface of the substrate 11 to a bottom surface of the substrate 11, traversing lateral side surfaces of the substrate 11. The first and second electrodes 110, 112 are made of metal, thereby providing electrical connection for an LED die to an external circuit.

Figure 2:
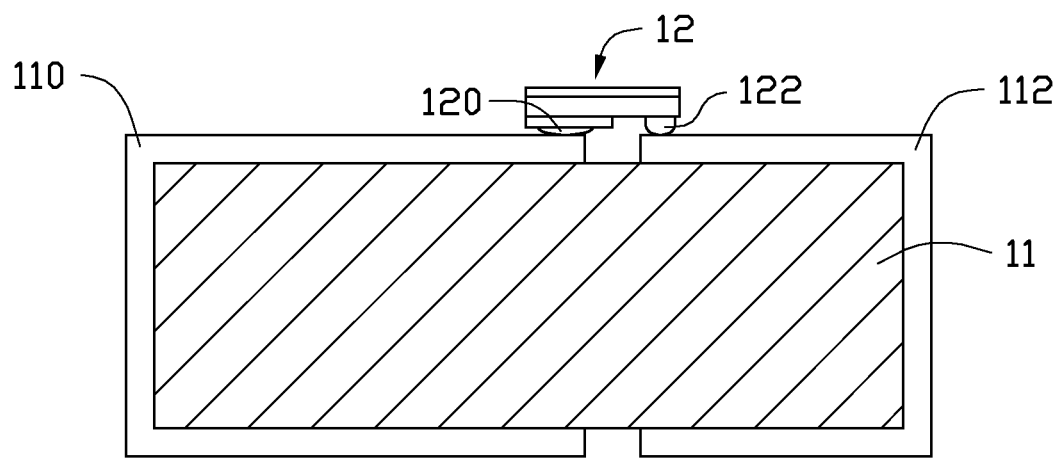

In step 2, referring to FIG. 2, an LED die 12 is arranged on the substrate 11 and electrically connected to the first and second electrodes 110, 112. In this embodiment, the LED die 12 is arranged on the substrate 11 and electrically connected to the first and second electrodes 110, 112 via bumps 120, 122, by flip chip. The LED die 12 straddles over top surfaces of the first and second electrodes 110, 112.

For mass production, the substrate 11 can also includes a plurality of first and second electrodes 110, 112 and a plurality of LED dies 12 arranged thereon. As such, after being packaged, the package can be cut into a plurality of LEDs each including a first electrode 110, a second electrode 112 and an LED die 12 and a part of the substrate 11. In following description and drawings, for simple instruction, the substrate 11 is configured with two first electrodes 110, two second electrodes 112 and two LED dies 12 arranged thereon.

Figure 3:
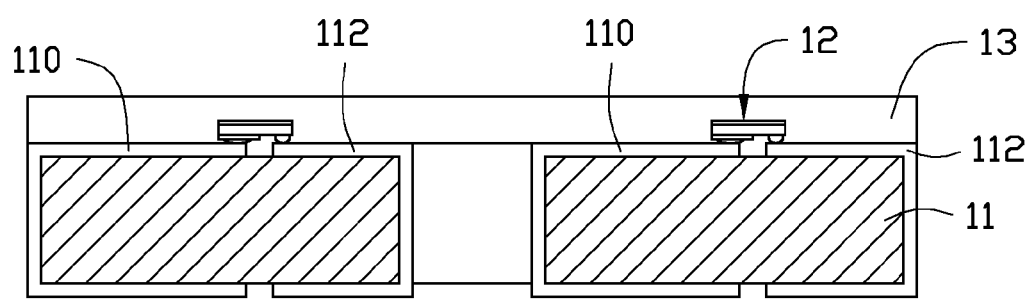

In step 3, referring to FIG. 3, a photoresist layer 13 is formed on the substrate 11 to cover the LED dies 12. In this embodiment, the photoresist layer 13 is made of negative photoresist material, and the photoresist layer 13 also covers top portions of the first electrodes 110 and the second electrodes 112.

Figure 4:
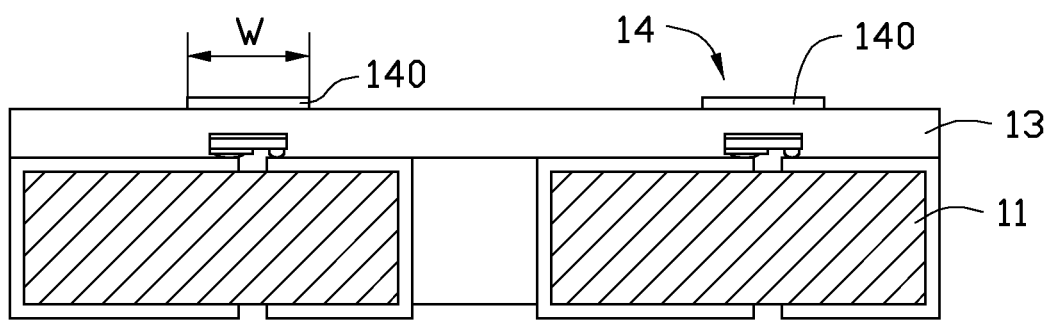

In step 4, referring to FIG. 4, a mask 14 is arranged directly on the photoresist layer 13. The mask 14 shelters portions of the photoresist layer 13 which are directly above the LED dies 12, respectively, and the remained portion of the photoresist layer 13 which surrounds the LED dies 12 is unsheltered. In this embodiment, the mask 14 includes a sheltering portion 140 for sheltering the portion of the photoresist layer 13 which is directly above the LED die 12, and the sheltering portion 140 has a width "W" bigger than that of the LED die 12. That is, the sheltering portion 140 has an area bigger than that of a top surface of the LED die 12. Thereby the sheltering portion 140 shelters the top surface of the LED die 12.

Figure 5:
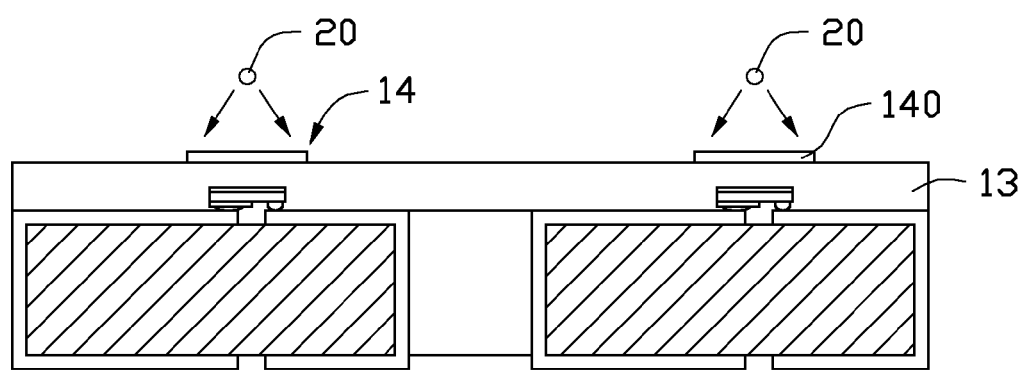
Figure 6:
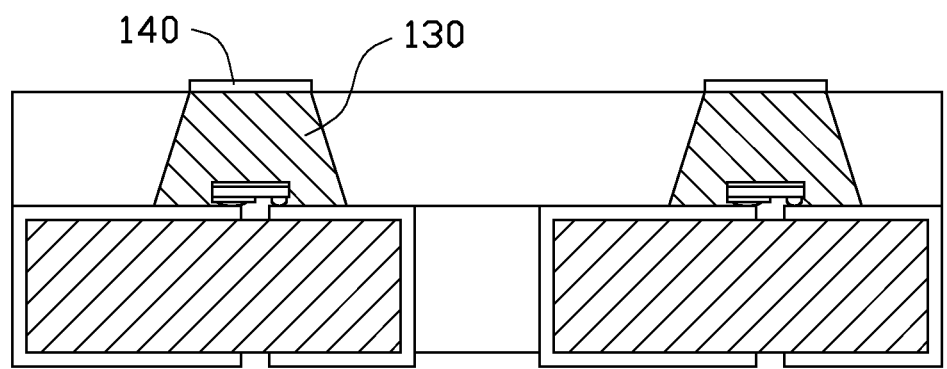

In step 5, referring to FIG. 5, the photoresist layer 13 with the mask 14 is exposed to a radiation source. In this embodiment, a light source 20 is provided to irradiate toward the remained portion of the photoresist layer 13 which is unsheltered by the mask 14. In this embodiment, the light source 20 emits ultraviolet radiation. Due to that the photoresist layer 13 is made of negative photoresist material in this embodiment, the portion of the photoresist layer 13 which is directly above the LED die 12 is unexposed and capable of being etched by developer solutions, and the portion of the photoresist layer 13 which surrounds the LED die 12 is exposed and unable of being etched by developer solutions. In this embodiment, the light source 20 is a point light source directly above the mask 14 and has a cone like radiation scope (as illustrated in FIG. 5 by arrows). Accordingly, under the radiation of the light from the light source 20, the unexposed portion 130 of the photoresist layer 13 has a shape of a truncated cone as illustrated in FIG. 6.

Figure 7:
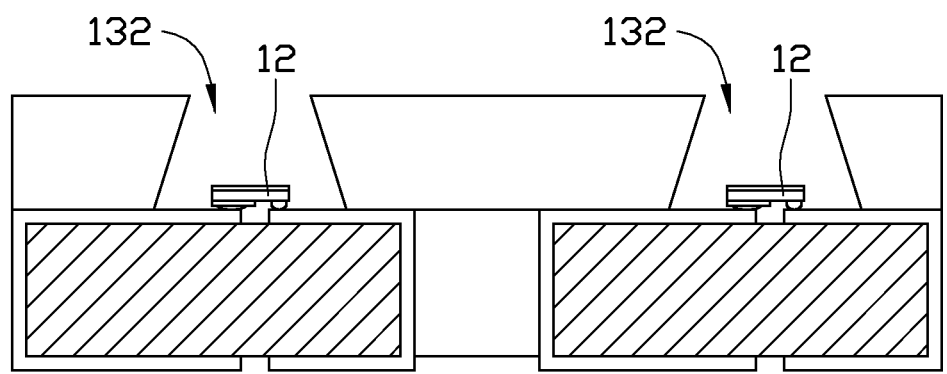

In step 6, the mask 14 is removed and the unexposed portion 130 of the photoresist layer 13 formerly sheltered by the mask 14 is etched away by developer solutions, thereby the exposed portion of the photoresist layer 13 formerly unsheltered by the mask 14 (i.e. the remained portion of the photoresist layer 13 which surrounds the LED die 12) is remained. Referring to FIG. 7, after the unexposed portion 130 is etched away, a truncated cone-shaped recess 132 is formed which is surrounded by the remained exposed portion of the photoresist layer 13. Thereby, the LED die 12 is received in the recess 132 and exposed to an outside via the recess 132. The recess 132 is formerly occupied by the unexposed portion 130 of the photoresist layer 13.

Figure 8:
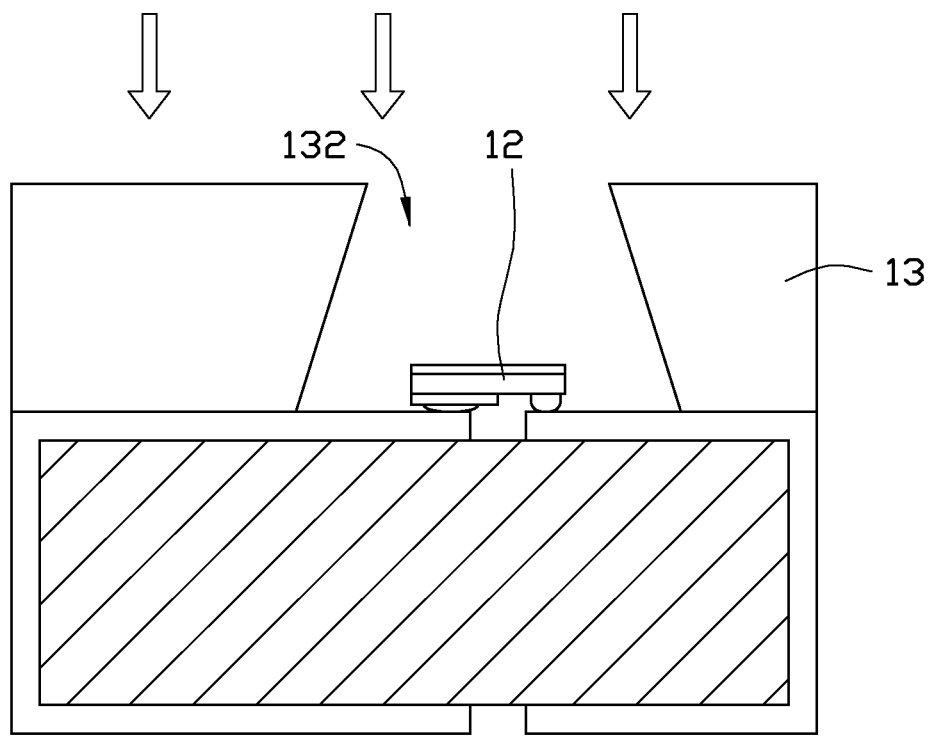
Figure 9:
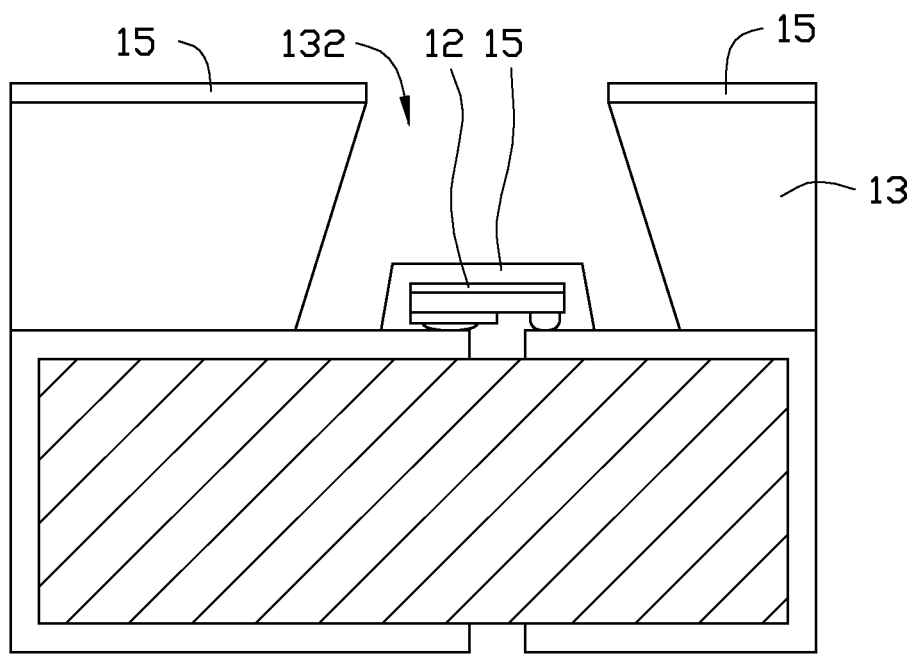

In step 7, referring to FIG. 8, fluorescent material is sprayed toward the LED die 12 to form a fluorescent layer 15 directly and conformably covering the LED die 12. In this embodiment, the fluorescent material is sprayed toward the recess 132 and the remained portion of the photoresist layer 13 which surrounds the LED die 12 along a direction which is perpendicular to a top surface of the remained exposed portion of the photoresist layer 13. Due to that the sheltering portion 140 has an area bigger than that of the top surface of the LED die 12 and the recess 132 has a biggest size at a bottom thereof, the top surface and lateral side surfaces of the LED die 12 are all exposed to the outside via the recess 132 vertically. Accordingly, after step 7, the top surface and lateral side surfaces of the LED die 12 are all coated with the fluorescent layer 15 as illustrated in FIG. 9. Simultaneity, the top surface of the remained exposed portion of the photoresist layer 13 is also coated with the fluorescent layer 15.

Figure 10:
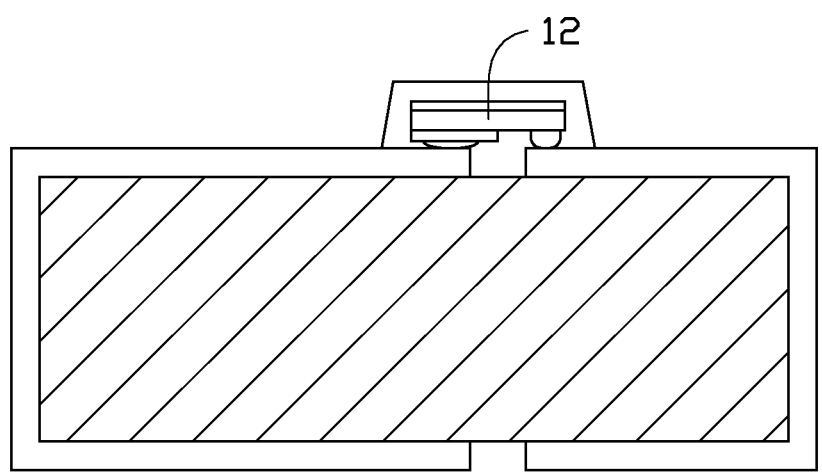

In step 8, referring to FIG. 10, the remained exposed portion of the photoresist layer 13 is removed. In this embodiment, the remained exposed portion of the photoresist layer 13 is removed by etching. The side inner wall of the recess 132 can effectively increase a contacting area of etching solution and the remained exposed portion of the photoresist layer 13, thereby making the remained exposed portion of the photoresist layer 13 capable of being etched more easily and quickly.

Figure 11:
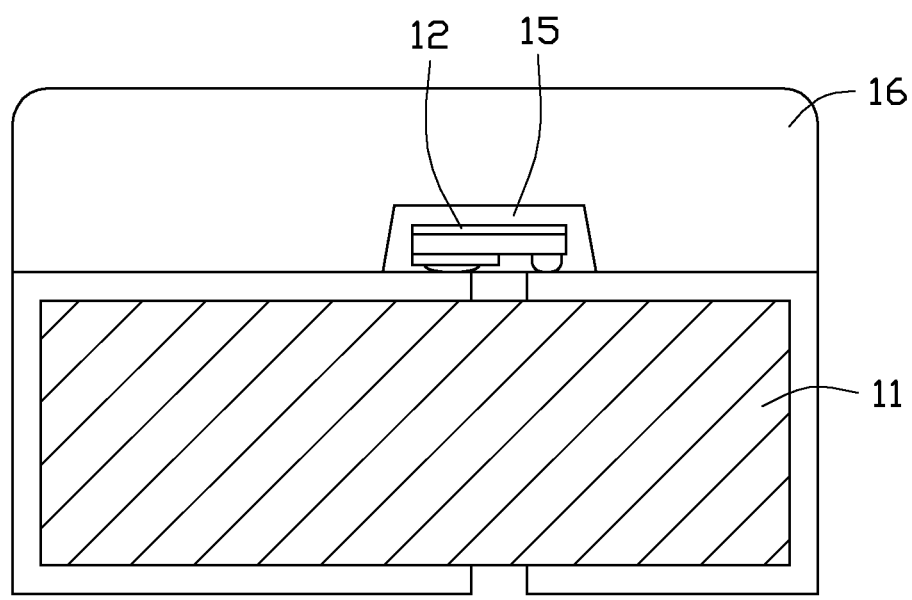

In step 9, referring to FIG. 11, the LED die 12 covered by the fluorescentlayer 15 is encapsulated thereby to form the LED in accordance with the present disclosure.

Due to that the fluorescent layer 15 is formed by directly spraying fluorescent material toward the LED die 12, a thickness and density distribution of the fluorescent layer 15 can be easily controlled, thereby avoiding non-uniform distribution of the fluorescent material confronted in the common LED packaging method. Accordingly, light generated by the LED of the present disclsoure can have a uniform color.

An LED packaging method in accordance with a second embodiment is also provided, which is generally similar to the LED packaging method of the first embodiment.

Figure 12:
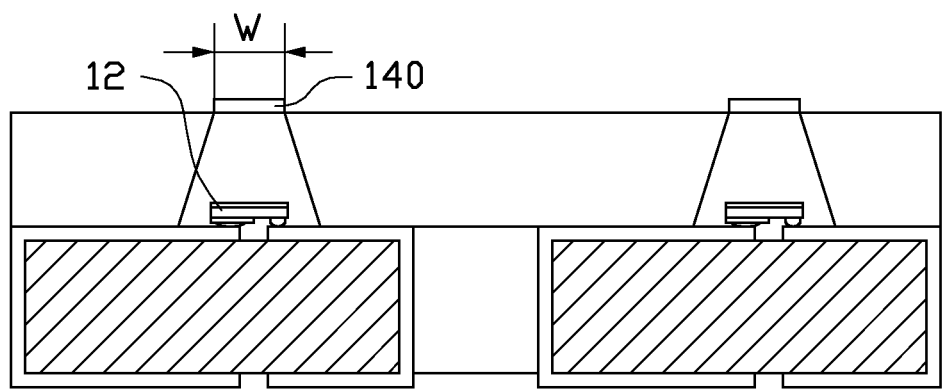
FIG. 12 is a schematic cross section showing an LED package structure of an LED package obtained from a second embodiment of the method of the present disclosure.
Figure 13:
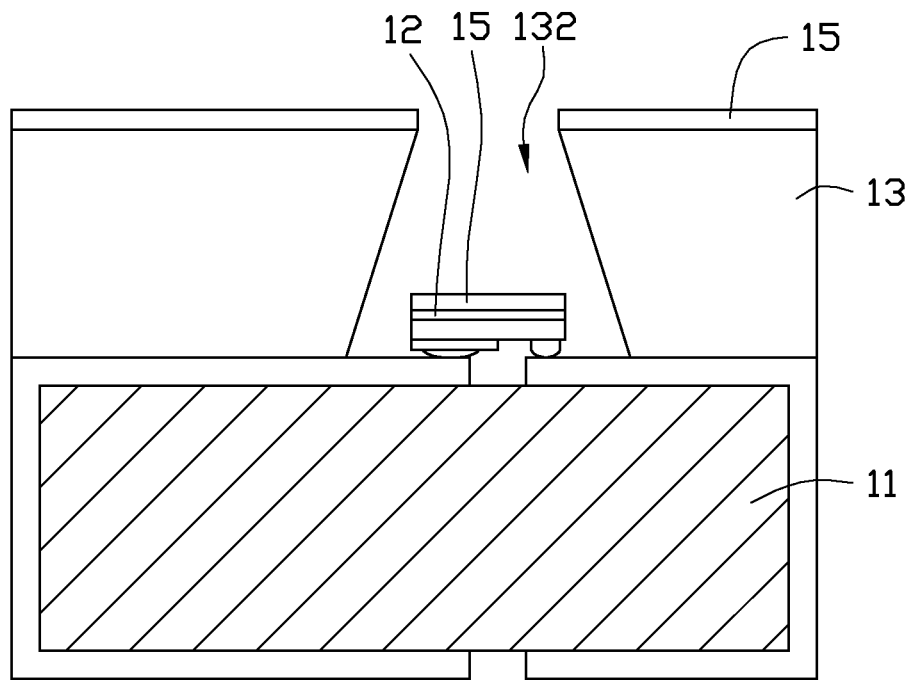
FIG. 13 is a schematic cross section showing an LED package structure of the LED package obtained by further processing the LED package structure of FIG. 12.

What is different from the LED packaging method of the first embodiment is that, the sheltering portion 140 provided in the LED packaging method of the second embodiment has a width "w" slightly smaller than that of the LED die 12. That is, the sheltering portion 140 of the second embodiment has an area slightly smaller than that of the top surface of the LED die 12 as illustrated in FIG. 12. This configuration of the sheltering portion 140 make the recess 32 has a top opening slightly smaller than the top surface of the LED die 12. As such, only the top surface of the LED die 12 is exposed to the outside vertically via the top opening of the recess 32. Accordingly, when spraying fluorescent material toward the recess 132, only the top surface of the LED die 12 will be coated by the fluorescent layer 15, which may be required in some applications.

It is to be said that, the photoresist layer 13 can also be made of positive photoresist material, and accordingly the sheltering portion 140 should be arranged to merely shelter a portion of the photoresist layer 13 which surrounds the LED die 12, with the remained portion of the photoresist layer 13 which is directly above the LED die 12 unsheltered.

Furthermore, the above method can also include a step of forming a reflective cup on the substrate 11 to adjust light output direction thereof, before the step 9.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for packaging an LED, comprising the steps of:
   providing a substrate with a first electrode and a second electrode arranged thereon;
   arranging an LED die on the substrate and electrically connecting the LED die to the first and second electrodes;
   forming a photoresist layer on the substrate to cover the LED die;
   arranging a mask directly above the photoresist layer;
   exposing the photoresist layer with the mask to a radiation source;
   removing the mask and the unexposed portion of the photoresist layer formerly sheltered by the mask, thereby leaving the exposed portion of the photoresist layer formerly unsheltered by the mask on the substrate, the remained exposed portion of the photoresist layer surrounding the LED die;
   spraying fluorescent material toward the LED die surrounded by the remaining exposed portion of the photoresist layer to form a fluorescent layer directly covering the LED die;
   removing the remaining exposed portion of the photoresist layer; and
   encapsulating the LED die covered by the fluorescent material.

2. The method of claim 1, wherein the photoresist layer is made of negative photoresist material.

3. The method of claim 1, wherein the mask comprises a sheltering portion with an area bigger than that of a top surface of the LED die, thereby the sheltering portion sheltering an entirety of the top surface of the LED die.

4. The method of claim 3, wherein the fluorescent material is sprayed to cover the top surface and lateral side surfaces of the LED die.

5. The method of claim 1, wherein the mask comprises a sheltering portion with an area smaller than that of a top surface of the LED die.

6. The method of claim 5, wherein the fluorescent material is sprayed to merely cover the top surface of the LED die.

7. The method of claim 1, wherein the photoresist layer is exposed to an ultraviolet radiation.

8. The method of claim 1, wherein the unexposed portion of the photoresist layer is removed by etching of developer solution.

9. The method of claim 8, wherein the unexposed portion of the photoresist layer is removed to define a truncated cone-shaped recess surrounded by the remaining exposed portion of the photoresist layer, thereby exposing the LED die received in the recess to an outside, wherein the recess is formerly occupied by the unexposed portion of the photoresist layer.

10. The method of claim 1, wherein the remaining exposed portion of the photoresist layer is removed by etching.

* * * * *